United States Patent [19]
Vakilian

[11] Patent Number: 6,094,355
[45] Date of Patent: Jul. 25, 2000

[54] HIGH-DENSITY COMPUTER MODULES WITH DOUBLE-LAYER PACKAGING

[75] Inventor: Kavous Vakilian, Laguna Hills, Calif.

[73] Assignee: Viking Components, Rancho Santa Margarita, Calif.

[21] Appl. No.: 09/055,193

[22] Filed: Apr. 4, 1998

[51] Int. Cl.[7] ..................................................... H05K 7/02
[52] U.S. Cl. ...................... 361/761; 361/748; 361/760; 361/764; 361/767; 361/784; 257/686; 257/777; 257/678; 257/712; 257/723; 257/724; 174/250; 174/255
[58] Field of Search .................................... 361/761, 792, 361/748, 760, 764, 767, 784; 257/685, 686, 777, 678, 668, 712, 723, 724, 731, 729, 701, 700; 174/250, 255

[56] References Cited

U.S. PATENT DOCUMENTS

| | | |
|---|---|---|
| 5,191,404 | 3/1993 | Wu et al. ................................. 257/724 |
| 5,412,538 | 5/1995 | Kinnis et al. ............................ 361/792 |
| 5,513,135 | 4/1996 | Dell et al. ................................. 365/52 |
| 5,652,462 | 7/1997 | Matsunaga et al. ..................... 257/686 |
| 5,661,339 | 8/1997 | Clayton .................................... 257/678 |
| 5,696,395 | 12/1997 | Tseng ....................................... 257/308 |
| 5,708,297 | 1/1998 | Clayton .................................... 257/723 |
| 5,754,408 | 5/1998 | Derouiche ............................... 361/773 |

*Primary Examiner*—Leo P. Picard
*Assistant Examiner*—David Foster
*Attorney, Agent, or Firm*—Oppenheimer Wolff & Donnelly LLP

[57] ABSTRACT

An expansion module for mounting in an expansion slot of a computer includes a board with a plurality of apertures formed therein. Each aperture has a first chip package disposed substantially therein and a second chip package mounted to the board in a substantially spaced relationship to the first chip package. An interface is disposed on the board for engaging with the computer. By disposing one of the chip packages within the aperture and the other chip packaged in a spaced relationship therewith, the chip density may be essentially doubled over conventional boards.

27 Claims, 4 Drawing Sheets

HIGH-DENSITY COMPUTER MODULES WITH DOUBLE-LAYER PACKAGING

FIELD OF THE INVENTION

The present invention is directed to computer boards and, more particularly, to expansion modules for mounting in an expansion slot of a computer.

BACKGROUND OF THE INVENTION

It is well known that in the electronics industry, particularly the personal computer industry, that the trend is to design products which are smaller, lighter, and more compact while maintaining or increasing power, speed, and memory capacity. In recent years, the computer industry has experienced the advent of the portable computer, including the lap-top computer, the notebook computer, and now the palm-top computer. Although these computers are amazingly compact and lightweight, they are still incredibly powerful and fast. They are capable of running software applications that only in the recent past were able to be run on desk-top computers with large amounts of memory.

Personal computers, which include portable computers as well as desk-top computers, include a motherboard for controlling the operation of the computer. Personal computers are sold with a specified amount of memory and hard drive space, for example, 1.2 gigabytes (GB) of hard drive and 64 megabytes (MB) of random access memory (RAM). Much of the hard drive is used up by software which is pre-stored or "bundled" in the computer prior to its sale. As such, many computer users like to upgrade or increase the available memory of their computers. Accordingly, manufacturers configure motherboards to include expansion slots in which a computer module such as a memory card may be inserted. The expansion slots may also receive computer modules or cards for upgrading a particular function of the computer, such as cards for sounds, video, and graphics. Although there are expansion slots which have standard configurations in the industry, such as a dual in-line memory module (DIMM) slot, the motherboards of many computers have expansions slots with a configuration which is proprietary to a particular manufacturer or to a particular model of computer.

It is well known that computers are becoming smaller and more compact. Accordingly, the space available inside the computer to accommodate expansion modules is decreasing. Therefore, in order to install a more powerful module, for example, a memory module with a larger amount of memory, in a smaller space, manufacturers need to develop modules which are as powerful or have as much capacity as possible for a given amount of space.

Accordingly, in view of the foregoing, it is an object of the present invention to provide an expansion module which maximizes the number of chips per unit volume, i.e., chip density.

SUMMARY OF THE INVENTION

This and other objects are achieved by the apparatus of the present invention which provides modules for expanding the capabilities of a computer. The expansion modules increase chip capacity (while maintaining essentially the same overall dimensions of the module) by disposing chip packages in a layered configuration. The layered configuration entails disposing one chip package substantially within an aperture formed in a board and disposing another chip package in a substantially spaced and parallel-plane relationship with the package within the aperture. Accordingly, the overall thickness of the module is defined substantially by the thickness of the board added to the thickness of only one chip package. Although capable of performing all types of functions typical of expansion modules, the module of the present invention is particularly suitable for expanding the memory of a computer, be it either desk top or portable.

According to one aspect of the invention, a module which may be mounted in an expansion slot of a computer includes a board with an aperture formed therein. An interface is disposed on the board for engaging with the computer. A chip package is disposed on or mounted to the board so as to be substantially within or coextensive with the aperture. A second chip package may also be mounted to the board in a substantially spaced relationship with the chip package mounted within the aperture. By layering the chip packages in this manner, the chip density of the module may be essentially doubled over conventional modules. In many embodiments of the invention, the board of the module may include a plurality of apertures, each with at least one chip package mounted therein. Each chip package includes a pin arrangement for mounting the chip to the board.

The present invention allows manufacturers to provide a module with increased capacity or functionality while maintaining substantially the same overall dimensions as those of conventional modules. This feature of the invention is particularly beneficial as computers, especially portable computers, become increasingly small and compact. The smaller the computer becomes, the smaller the size of the space in which an expansion module may be inserted inside the computer. Accordingly, the size of existing modules may be reduced to fit in smaller spaces or, alternatively, more powerful modules with more chips may be disposed on boards without increasing the overall dimensions of the board.

Other aspects, features, and advantages of the present invention will become apparent to those persons having ordinary skill in the art to which the present invention pertains from the following description taken in conjunction with the accompanying drawings.

DETAILED DESCRIPTION OF EXEMPLARY EMBODIMENTS

Figure 1:
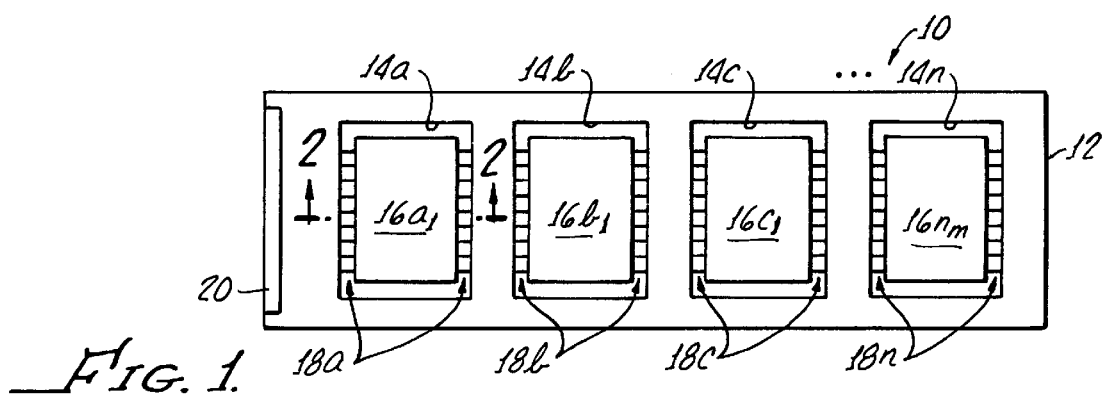
FIG. 1 is a plan view of an exemplary computer module, particularly configured as an expansion board, in accordance with the present invention.

Referring to the drawings, principles of the present invention are exemplified by a module 10 illustrated in FIG. 1. Exemplary module 10 includes a board 12 in which at least one but preferably a plurality of apertures 14 are formed. With additional reference to FIGS. 2A and 2B, each aperture 14 has at least one chip package 16 but preferably a pair of chip packages 16 mounted therein. Each chip package 16 includes an integrated circuit (IC), which is not shown in the drawings but which is known in the art, and a pin arrangement 18. A slot interface 20 is disposed on exemplary board 12 for connecting with a corresponding and complementary interface on a computer.

A referencing convention used in this description is defined by components being generally referenced with a numeral, e.g., apertures 14, and specifically referenced with an alpha suffix, e.g., aperture 14a. In addition, more specific reference is provided for multiple chip packages 16 corresponding to a particular aperture 14. For example, in FIG. 2D, aperture 14a has a plurality of chip packages $16a_1$, $16a_2$, ... $16a_m$. This referencing convention will he used throughout this description.

Returning to FIGS. 2A and 2B, each aperture 14 may have one or more chip packages 16 mounted therein. Each aperture 14 has a perimeter which defines a planar boundary thereof. Adding a thickness of board 12 to the planar boundary defines a spatial boundary of aperture 14. As shown in FIG. 2A, chip package $16a_1$, is substantially coextensive with aperture 14a and/or substantially coplanar with board 12. When an aperture 14 has plural chip packages 16, the chip packages may be layered in a substantially spaced and parallel-plane relationship and may be substantially aligned with each other. A space S defined between chip packages 16a, and $16a_2$ is preferably minimized to minimize an overall thickness $T_1$ of module 10, while still allowing air to circulate between the packages for cooling purposes.

Figure 2B:
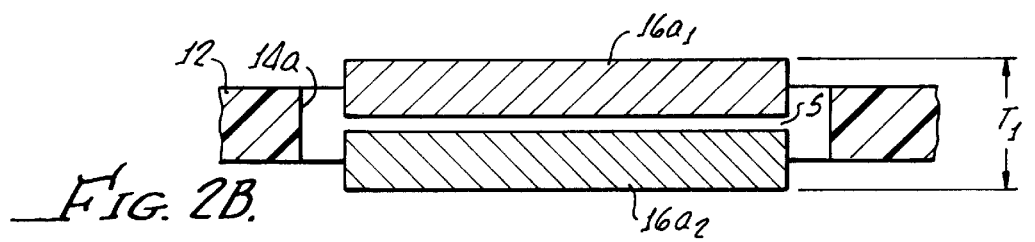
FIG. 2B is view similar to that of FIG. 2A, illustrating a pair of chip packages mounted within an aperture of a board according to another exemplary embodiment of the invention.
Figure 2C:
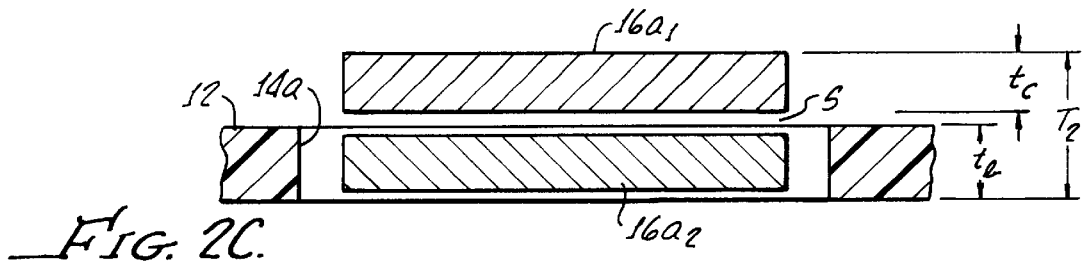
FIG. 2C is view similar to that of FIG. 2A, illustrating a pair of chip packages mounted within an aperture of a board according to yet another exemplary embodiment of the invention.
Figure 2A:
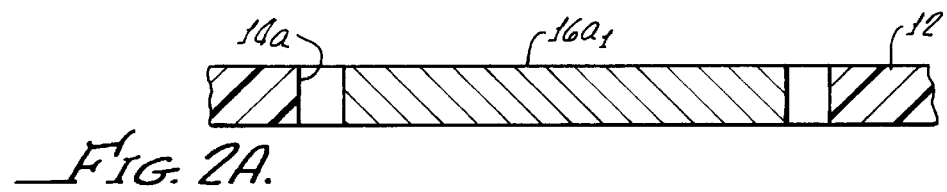
FIG. 2A is a cross-sectional view of the computer module taken along line 2—2 of FIG. 1, illustrating a chip package mounted within an aperture of a board according to an exemplary embodiment of the invention.

Referencing FIGS. 2B and 2C, if a pair of chip packages $16a_1$ and $16a_2$ are mounted in aperture 14a, the packages 16 may be evenly positioned or balanced with respect to the aperture, as shown in FIG. 2B. Alternatively, one package, e.g., $16a_2$, may be mounted substantially within aperture 14a, with the other chip package $16a_1$ mounted in a spaced and substantially parallel-plane relationship thereto, as shown in FIG. 2C. In both configurations, thickness $T_1$ and thickness $T_2$ of module 10 may be substantially equal. As can be seen in FIG. 2C, the overall thickness $T_2$ of module 10 may be defined to be substantially equal to a thickness $t_b$ of board 12 added to a thickness $t_c$ of only one chip package 16. In at least one proprietary embodiment of module 10, the overall thickness T is less than 0.1 inch, which will be discussed in more detail below. Although space S may add to the overall thickness T of the module, in most configurations space S is negligible with respect to the thicknesses of the board and the chip packages.

Figure 2D:
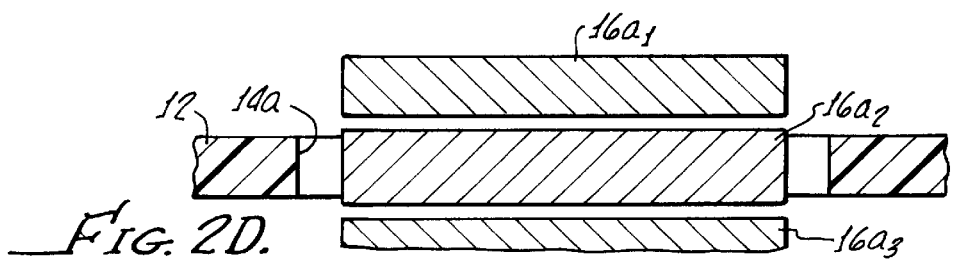
FIG. 2D is view similar to that of FIG. 2A, illustrating a plurality of chip packages mounted within an aperture of a board according to still another exemplary embodiment of the invention.

With reference to FIG. 2D, a plurality of layered chip packages $16a_{1-3}$ are shown mounted in aperture 14a. Chip package $16a_2$ is mounted substantially within aperture 14a, with chip packages $16a_1$ and $16a_3$ mounted in a substantially spaced and parallel-plane relationship thereto. This layered configuration essentially "sandwiches" chip package $16a_2$. Chip packages $16a_{1-3}$ may be the same type of chip, such as memory chip, or each may a different type of chip.

Any combination of chip packages 16, i.e., single or plural, may be mounted in each aperture 14 depending upon the desired function and/or configuration of module 10.

As mentioned above, the pin arrangement 18 of each chip package 16 mounts the chip package to board 12, as shown in FIG. 1. Pin arrangements may interface either directly to specific conductive layers of board 12, or indirectly through additional interfacing structure such as a socket, as known in the art. Board 12 may be a printed circuit board (PCB) or a printed wiring board (PWB). Board 12 may also be fabricated as a multi-layered board as known in the art. In addition to expansion modules, module 10 may be a motherboard, video card, or other such type of component including a board and chips used in a computer.

Figure 3:
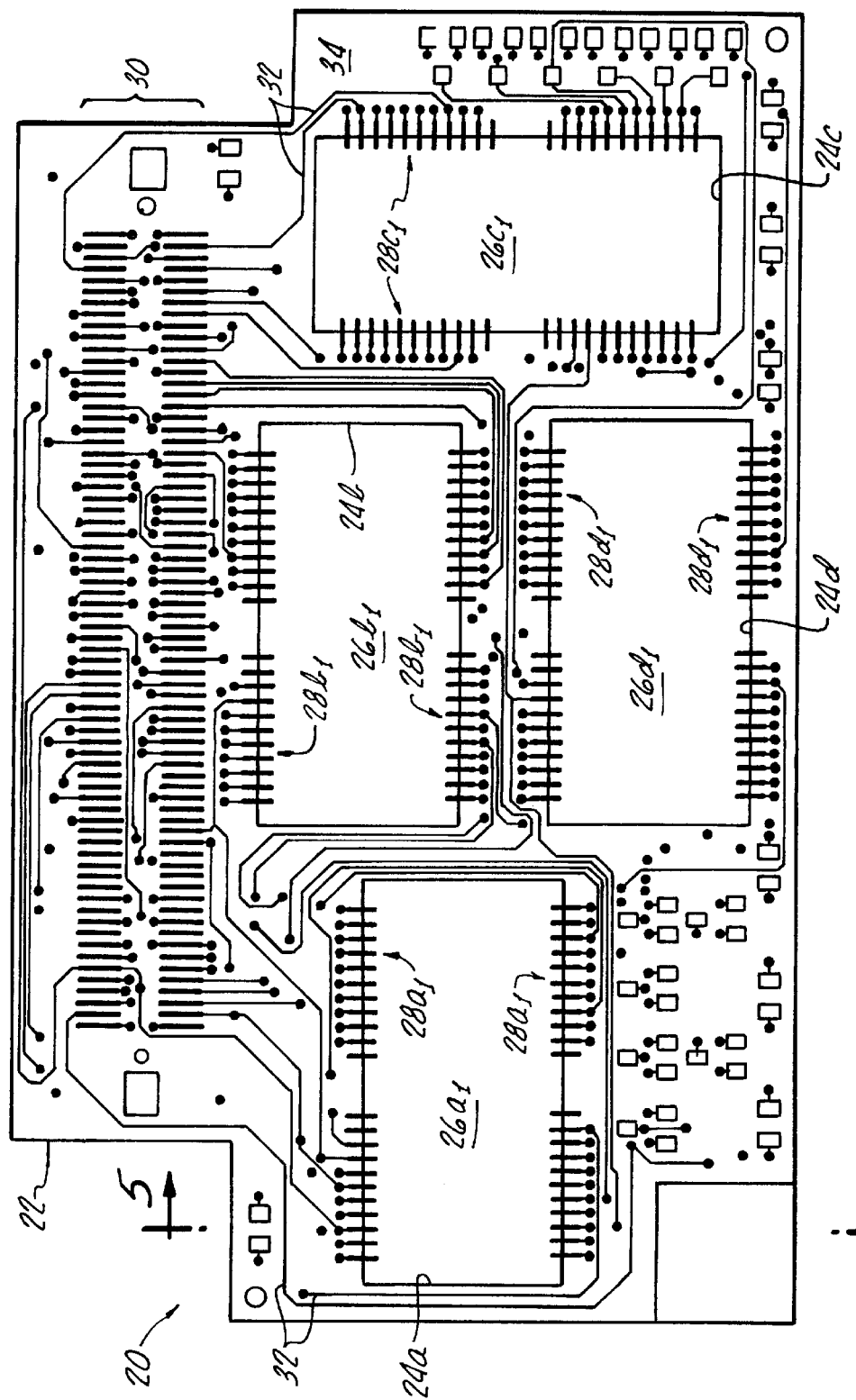
FIG. 3 is a view of a preferred proprietary configuration of an expansion module of the invention, illustrating a top side of the module.

In many applications and embodiments of the invention, board 12 may be configured in a proprietary manner depending upon the brand and/or model of computer with which exemplary module 10 may be used. Board 12 may also be configured to be compatible with a family or series of computers. In this regard, reference is made to FIGS. 3, 4, and 5 which illustrate a proprietary commercial embodiment of module 20 of the invention. Proprietary module 20 includes a board 22 in which a plurality of apertures 24 are formed. Each aperture 24 has a pair of chip packages 26 mounted therein. Each chip package 26 has a pin arrangement 28 for mounting the chip package to board 24. A slot interface 30 including a plurality of electrical contacts is disposed on board 12 and connects the board with a corresponding and complementary interface on a computer. Circuitry 32 is formed on both sides of board 22. Exemplary circuitry 32 may include leads for connecting each pin arrangement 28 to slot interface 30, as well as other electrical components, for example, capacitors and diode switches, to aid in the function of module 20, as known in the art. Also, slot interface 30 may be configured in accordance with standards in the industry or in a proprietary manner depending upon the type of computer with which module 20 is to be used, as known in the art.

Figure 4:
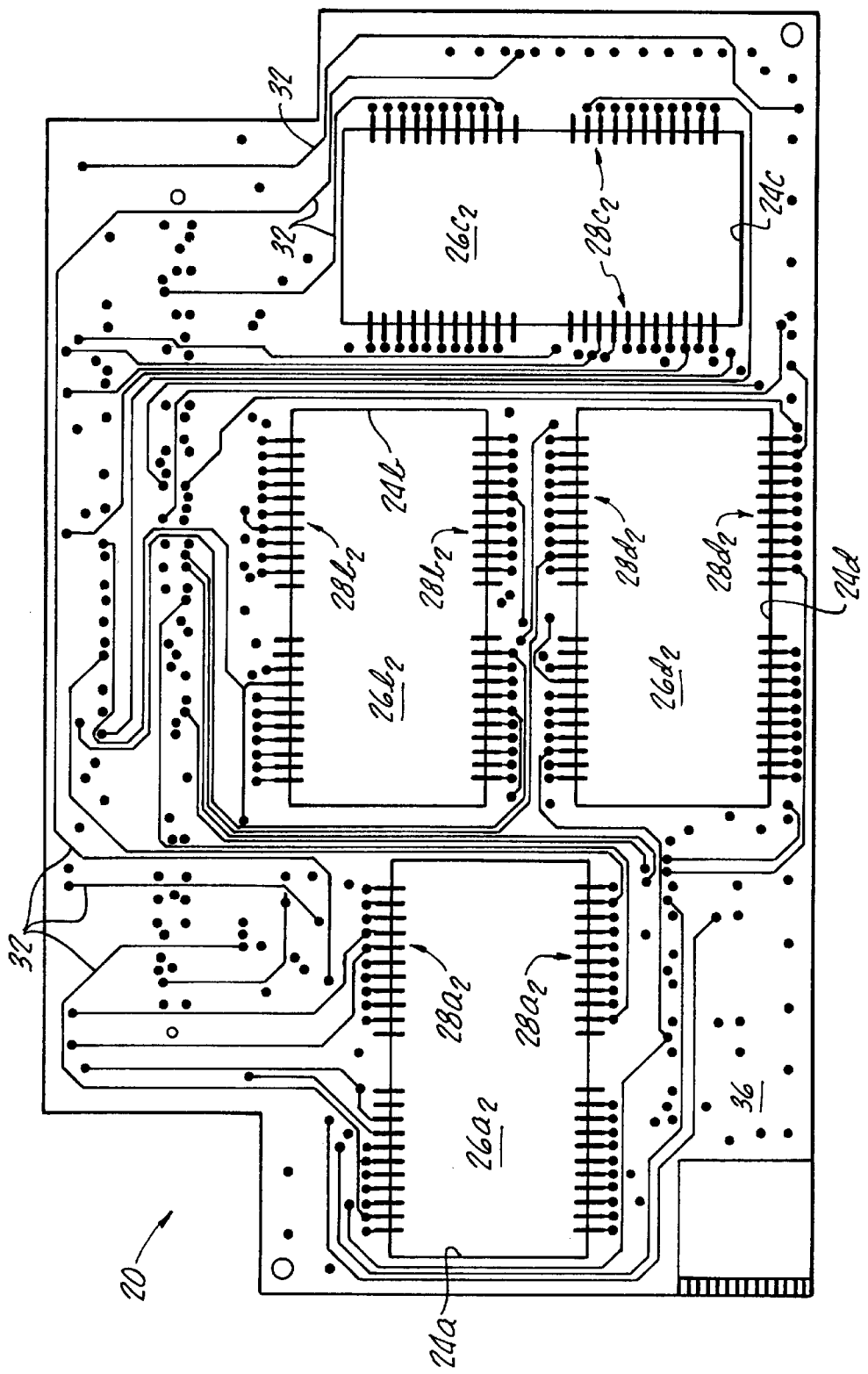
FIG. 4 is a view similar to that of FIG. 4, illustrating a bottom side of the module.
Figure 5:
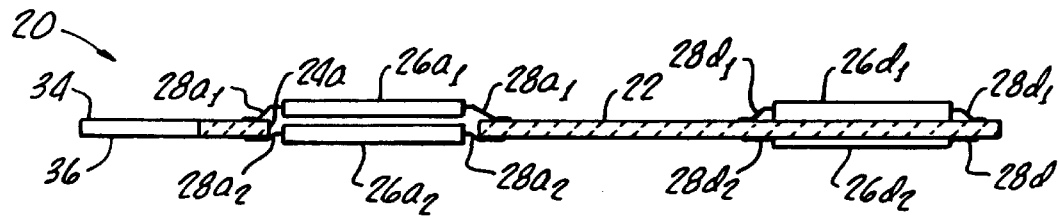
FIG. 5 is a cross-sectional view taken along line 5—5 of FIG. 3, illustrating a pair of chip package mounted in an aperture in accordance with a preferred embodiment of the invention.

As shown in FIG. 5, each pin arrangement 28 connects a respective chip package 26 to either a top side 34 of board 22 (also shown in FIG. 3) or a bottom side 36 of board 22 (also shown in FIG. 4). For example, pin arrangement $28a_1$ mounts chip package 26a to the top side 34 of board 22, and pin arrangement $28a_2$ mounts chip package 26b to the bottom side of board 22. In addition, pin arrangements 28 may be configured so that one of the chip packages 26 of a corresponding pair is mounted substantially coextensively within a respective aperture 24, while the other chip package 26 of the pair is mounted in a substantially spaced relationship therewith.

For example, chip package $26a_2$ is mounted substantially within aperture 24a, while chip package $26a_1$ is mounted in a substantially spaced and parallel-plane relationship therewith, as shown in FIG. 5.

Figure 6:
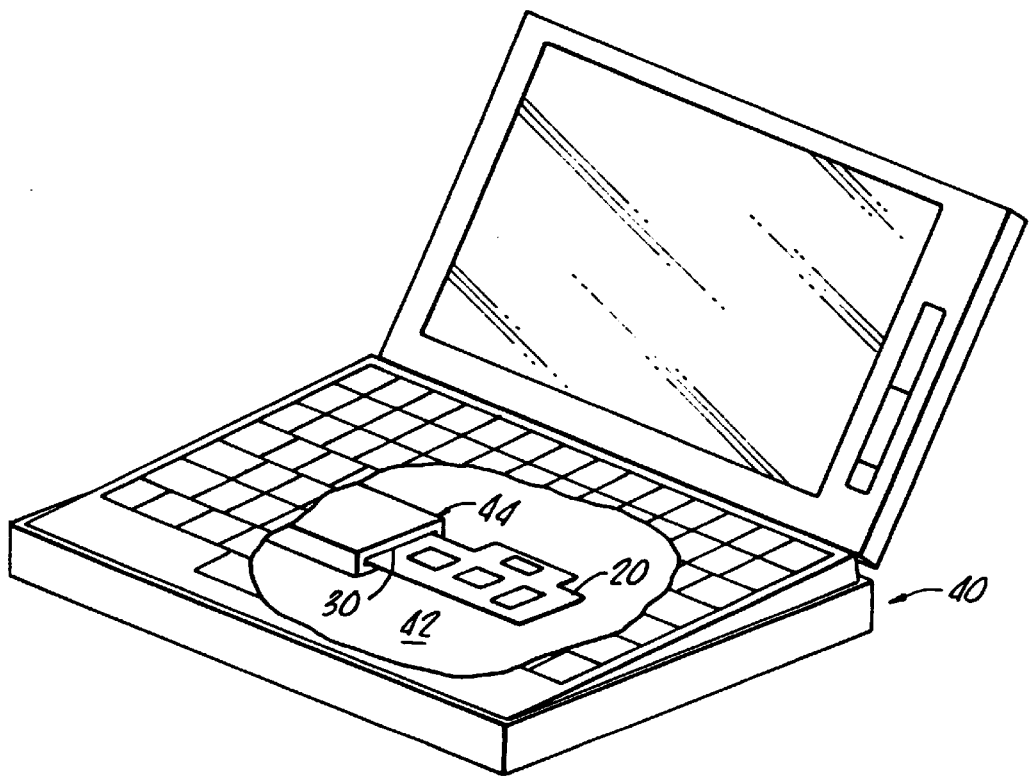
FIG. 6 is a fragmentary cross-sectional view of a portable computer in which an exemplary expansion module is mounted in accordance with the present invention.

With reference to FIG. 6, proprietary module 20 may be configured as a memory module for use with a portable computer 40, for example, a Toshiba Libretto® palm-top computer. Board 20 is dimensioned and configured to fit within proprietary space 42 defined within computer 40.

Space 42 is provided adjacent to an expansion slot 44 to accommodate expansion module 20 when inserted in slot 44.

Each chip package 26 of exemplary memory module 20 may include an integrated circuit (IC), such as a 16-megabyte (MB) memory IC. Accordingly, if memory module 20 is provided with four apertures 24 and if each aperture 24 has two chip packages 26 associated therewith, then memory module 20 includes eight chip packages 26 and may provide 128 MB of memory.

As chip manufacturers develop memory chips with greater capacity, then memory module 20 will be able to provide an even greater capacity of memory. In a general sense, the memory capacity of module 20 may be calculated to be substantially equal to the quotient of the number of apertures 24, the number of chip packages 26 per aperture, and the memory capacity of each chip package 26. For example, if module 20 has five apertures 24 each with three chip packages 26 of 16 MB of capacity, then module 20 provides about 240 MB of memory.

The space or tolerance between each chip package 26 and a respective aperture 24 may be minimized as much as possible to yield a module 20 which is as small and dense as possible. In this regard, the overall dimensions of memory module 20 configured for portable computers may be less than about 3 inches in length and less than about 2 inches in width. Apertures 24 may be less than about 1 inch in length and less than about ½ inch in width, depending upon the size of the chip packages. The overall thickness may be less than about ¼ inch. More specifically, proprietary module 20 configured for a Toshiba Libretto® palm-top computer may be about 2.845 inches in length by 1.69 inches in width by 0.09 inch in overall thickness, with apertures 24 being about 0.88 inch in length by about 0.43 inch in width.

Those skilled in the art will understand that the embodiments of the present invention described above exemplify the present invention and do not limit the scope of the invention to these specifically illustrated and described embodiments. For example, rather than mounting one chip package within or substantially coextensive with an aperture, a layer two or more chip packages may be mounted side by side within a single aperture, with another layer of chip packages mounted in a spaced relationship thereto. Accordingly, the scope of the invention is determined by the terms of the appended claims and their legal equivalents, rather than by the described examples. In addition, the exemplary embodiments provide a foundation from which numerous alternatives and modifications may be made, which alternatives and modifications are also within the scope of the present invention as defined in the appended claims.

What is claimed is:

1. A module for mounting in a computer, comprising:
   a board;
   an aperture formed through said board, wherein said aperture extends completely through said board from an upper surface to a lower surface thereof;
   a chip package mounted to said board substantially within said aperture, said chip package having an upper surface and a lower surface; and
   a continuous uninterrupted cooling air layer extending from an outer edge of said chip package to an opposite outer edge of said chip package and from said upper surface of said chip package to outwardly beyond said upper surface of said board;
   wherein cooling air being allowed to flow through said aperture to cool said chip package; and
   wherein said upper surface and said lower surface of said chip package being left exposed to communicate directly with the cooling air to radiate heat from said chip package to the cooling air.

2. The module of claim 1 further comprising a second chip package mounted to said board in a substantially spaced relationship with said chip package mounted within said aperture such that said second chip package being disposed above said chip package mounted within said aperture.

3. The module of claim 2 wherein said chip packages are substantially parallel with each other.

4. The module of claim 1 further comprising a plurality of chip packages, wherein said board includes a plurality of apertures;
   each of said apertures having at least one of said chip packages mounted to said board substantially therewithin.

5. The module of claim 4 wherein each of said apertures has another one of said chip packages mounted to said board in a spaced relationship with said at least one of said chip packages such that said another one of said chip packages being above said at least one of said chip packages.

6. A module for mounting in an expansion slot of a computer board, said module comprising:
   a board including an aperture formed therein and an interface for connecting with the expansion slot, wherein said aperture extends completely through said board from an upper surface to a lower surface thereof;
   a first chip package mounted substantially within said aperture;
   a second chip package mounted in a substantially parallel-plane arrangement with said first chip package such that said second chip package being disposed directly above said first chip package; and
   a space defined between said first and second chip packages such that a continuous uninterrupted ambient air layer extends from outer edges of said first and second chip packages to opposite outer edges of said first and second chip packages and in between said first and second chip packages;
   wherein ambient air being allowed to flow through said aperture to cool said first and second chip packages.

7. The module of claim 6 wherein each of said first chip packages includes a pin arrangement connected to said board.

8. The module of claim 6 wherein said chip packages are substantially aligned with each other.

9. The module of claim 6 wherein said board includes a plurality of apertures;
   each said aperture having a first chip package mounted substantially therewithin and a second chip package mounted in a substantially spaced relationship with said first chip package thereof such that said second chip package being disposed above said first chip package.

10. The module of claim 9 wherein said chip packages include memory integrated circuits.

11. The module of claim 6 wherein said board is configured for mounting in the expansion slot of a portable computer.

12. An article of manufacture for receiving chip packages, each of the chip packages including a pin arrangement, said article of manufacture comprising:
   a board;
   an aperture formed in said board and defining a spatial boundary;
   said aperture being adapted to receive at least one chip package substantially within said spatial boundary thereof with the pin arrangement thereof connected to said board;

said aperture extending completely through said board from an upper surface to a lower surface thereof such that ambient air is allowed to flow through said aperture to cool said at least one chip package; and a continuous uninterrupted ambient air layer extending from an outer edge of said at least one chip package to an opposite outer edge of said at least one chip package and from said upper surface of said at least one chip package to outwardly beyond said upper surface of said board;

wherein said upper surface and said lower surface of said at least one chip package being left exposed to communicate directly with the ambient air to radiate heat from said at least one chip package to the ambient air.

13. An article of manufacture as claimed in claim 12 further comprising a plurality of apertures formed in said board;

each of said apertures being adapted to receive at least one chip package substantially within said spatial boundary thereof with the pin arrangement thereof connected to said board.

14. An article of manufacture as claimed in claim 12 wherein said board is a printed circuit board.

15. A computer comprising:

an expansion slot; and a module including:

a board including an interface connected to said expansion slot and a plurality of apertures each having a planar boundary, said plurality of apertures extending completely through said board from an upper surface to a lower surface thereof; and a plurality of pairs of chip packages, each of said pairs of chip packages including a first chip package and a second chip package, said first and second chip packages being stack mounted to said board in a substantially spaced relationship with each other and substantially aligned with said planar boundary of said aperture such that said first chip package being disposed below said second chip package; and a space defined between said first and second chip packages such that a continuous uninterrupted cooling air layer extends from outer edges of said first and second chip packages to opposite outer edges of said first and second chip packages and in between said first and second chip packages;

wherein cooling air being allowed to flow through said plurality of apertures to cool said plurality of pairs of chip packages;

wherein a lower surface of said first chip package being left exposed to communicate directly with the cooling air to radiate heat from said first chip package to the cooling air; and wherein an upper surface of said second chip package being left exposed to communicate directly with the cooling air to radiate heat from said second chip package to the cooling air.

16. A method for increasing memory capacity of a computer, said method comprising the steps of:

providing a computer including an expansion slot;

providing a memory module including:

a board having an interface configured to engage with said expansion slot of said computer and a plurality of apertures formed therein, said plurality of apertures extending completely through said board from an upper surface to a lower surface thereof; and a plurality of chip packages each including memory integrated circuits and a pin arrangement;

each of said apertures having at least one of said chip packages mounted in a substantially coextensive relationship therewith and with said pin arrangement thereof connected to said board, said plurality of chip packages having upper and lower surfaces being left exposed to communicate directly with cooling air to radiate heat from said plurality of chip packages to the cooling air; and a continuous uninterrupted cooling air layer extending from an outer edge of said chip packages to an opposite outer edge of said chip packages and from said upper surface of said chip packages to beyond said upper surface of said board; and inserting said interface of said memory module into said expansion slot of said computer.

17. A method as claimed in claim 16 wherein said board has a length of less than about 3 inches, a width of less than about 2 inches, and a thickness of less than about 0.25 inch.

18. A method as claimed in claim 17 wherein said board has four apertures with each aperture having two chip packages associated therewith.

19. A module for mounting in a computer, comprising:

a board having an upper surface and a lower surface;

an aperture formed through said board, wherein said aperture extends completely through said board from said upper surface to said lower surface thereof; and a first chip package and a second chip package mounted to said board partially within said aperture, said first and second chip packages stack mounted in a substantially parallel-plane arrangement such that said first chip package being disposed directly below said second chip package;

wherein said first chip package and said second chip package being substantially evenly positioned with respect to said aperture such that a bottom surface of said first chip package extends outwardly beyond said bottom surface of said board about a same distance as a top surface of said second chip package extends outwardly beyond said top surface of said board.

20. The module of claim 19 further comprising a plurality of additional chip packages, wherein said board includes a plurality of apertures;

each of said apertures having at least one of said additional chip packages mounted to said board and therewithin.

21. The module of claim 19 further comprising a space defined between said first and second chip packages such that a continuous uninterrupted cooling air layer extends from outer edges of said first and second chip packages to opposite outer edges of said first and second chip packages and in between said first and second chip packages, wherein cooling air being allowed to flow through said aperture to cool said first and second chip packages.

22. The module of claim 21 wherein a lower surface of said first chip package being left exposed to communicate directly with the cooling air to radiate heat from said first chip package to the cooling air, and wherein an upper surface of said second chip package being left exposed to communicate directly with the cooling air to radiate heat from said first chip package to the cooling air.

23. A module for mounting in a computer, comprising:

a board having an upper surface and a lower surface;

an aperture formed through said board, said aperture extending completely through said board from an upper surface to a lower surface thereof;

a first chip package mounted to said board substantially within said aperture, said first chip package having an upper surface and a lower surface;

a second chip package stack mounted in a substantially parallel-plane arrangement with said first chip package such that said second chip package being disposed directly above said first chip package; and a third chip package stack mounted in a substantially parallel-plane arrangement with said first chip package such that said third chip package being disposed directly below said first chip package.

24. The module of claim 23 further comprising:

a first space defined between said first and second chip packages such that a continuous uninterrupted cooling air layer extends from outer edges of said first and second chip packages to opposite outer edges of said first and second chip packages and in between said first and second chip packages; and a second space defined between said first and third chip packages such that a continuous uninterrupted cooling air layer extends from outer edges of said first and third chip packages to opposite outer edges of said first and third chip packages and in between said first and third chip packages.

25. The module of claim 24 wherein the space between the first and second chip packages is substantially the same as the space between the first and third chip packages.

26. The module of claim 23 further comprising a plurality of additional chip packages, wherein said board includes a plurality of apertures;

each of said apertures having at least one of said additional chip packages mounted to said board substantially therewithin.

27. The module of claim 26 wherein each of said apertures has another one of said additional chip packages mounted to said board substantially therewithin.

* * * * *